United States Patent [19]

Sugiyama

[11] 4,366,447

[45] Dec. 28, 1982

[54] PUSH-PULL AMPLIFIER CIRCUIT

[75] Inventor: Yoshinobu Sugiyama, Tokyo, Japan

[73] Assignee: Pioneer Electronic Corporation, Tokyo, Japan

[21] Appl. No.: 227,560

[22] Filed: Jan. 22, 1981

[51] Int. Cl.³ .............................................. H03F 3/26
[52] U.S. Cl. .................................... 330/267; 330/273
[58] Field of Search ............... 330/264, 265, 267, 268, 330/269, 270, 273, 274, 298

[56] References Cited

U.S. PATENT DOCUMENTS 4,306,199 12/1981 Kondou .............................. 330/268

Primary Examiner—James B. Mullins
Assistant Examiner—Gene Wan
Attorney, Agent, or Firm—Sughrue, Mion, Zinn, Macpeak and Seas

[57] ABSTRACT

A push-pull amplifier circuit which is fully compensated for shortages in bias at times of high power output and in which the transistors are always maintained in their active regions. The circuit includes at least one pair of output transistors coupled in a push-pull circuit arrangement. A variable bias generating circuit controls the bias voltages applied to the bases of the output transistors according to the currents flowing in the output transistors to cause the output transistors to operate in their active regions. A circuit applies the voltage variation components at supply terminals from which current is applied to the output transistors to the variable bias generating circuit to compensate for shortages in bias during times of high power output.

4 Claims, 6 Drawing Figures

PUSH-PULL AMPLIFIER CIRCUIT

BACKGROUND OF THE INVENTION

The present invention relates to a push-pull amplifier circuit which may be employed, for instance, as a power amplifier in an audio device.

A fundamental push-pull amplifier circuit is a class A or class B complementary amplifier circuit. The class A complementary amplifier circuit is advantageous in that no switching distortion is caused because the pair of output transistors it uses are operated in their active regions at all times and not at all in their cut-off regions. However, the class A circuit is disadvantageous in that the thermal loss is great because it is necessary to employ relatively large bias currents.

On the other hand, the class B complementary amplifier circuit is advantageous in that the thermal loss is small because the output transistors are operated with relatively small bias currents. However, the class B circuit suffers from a drawback in that switching distortion is present because the pair of output transistors it employs are operated alternately.

In view of the foregoing, the present applicant has proposed a push-pull amplifier circuit in which the occurrence of switching distortion, which is the primary drawback of the class B amplifier circuit, is prevented while the advantages of the class B amplifier circuit are retained. This amplifier is described in U.S. patent application Ser. No. 12,421 filed Feb. 15, 1979.

An example of this push-pull amplifier circuit is as shown in FIG. 1. The emitter of an NPN output transistor $Q_1$ and the emitter of a PNP output transistor $Q_2$ are connected respectively through resistors $R_1$ and $R_2$ to an output terminal OUT which is connected to a load $R_L$. The emitters of driver transistors $Q_3$ and $Q_4$ are connected to the bases of the output transistors $Q_1$ and $Q_2$ and are further connected to the output terminal OUT through resistors $R_3$ and $R_4$, respectively, thus forming an SEPP type amplifier circuit which is well known in the art. A base biasing circuit composed of an NPN transistor $Q_5$, diodes $D_3$ and $D_4$ and a PNP transistor $Q_6$, connected in the stated order, is coupled between the driver transistors $Q_3$ and $Q_4$. A constant current source $I_1$ supplies current to the circuit thus assembled and an input transistor $Q_7$ applies an input signal thereto. A resistor $R_5$ is connected between the base and collector of the transistor $Q_5$ and a resistor $R_6$ is connected between the base and collector of the transistor $Q_6$. The base and the emitter of the transistor $Q_5$ are connected to the emitter and the collector, respectively, of a transistor $Q_8$. The base and the emitter of the transistor $Q_6$ are connected to the emitter and the collector, respectively, of a transistor $Q_9$. The bases of the transistors $Q_8$ and $Q_9$ are connected, respectively, through diodes $D_1$ and $D_2$ to the output terminal OUT. Constant current sources $I_2$ and $I_3$ supply constant currents to the diodes $D_1$ and $D_2$, respectively.

When no signal is applied to the circuit, the potential between circuit points X and Y is equal to that between circuit points Z and Y; that is, a relation $V_X = V_Z$ is established. When the positive half cycle of an input signal is applied to an input terminal IN to provide a positive voltage at the output terminal OUT, current flows in the output transistor $Q_1$ to increase the voltage between the circuit points Z and Y. In this operation, the operating point of the transistor $Q_8$ is shifted from a point A to a point B in FIG. 2 with a current $i_2$ flowing in the transistor $Q_8$. Accordingly, the voltage between the circuit points X and Y (the bias voltage) is maintained equal to the voltage between the circuit points Z and Y, including the voltage drop across the resistor $R_1$. That is, the relation $V_X = V_Z$ is maintained and the PNP output transistor $Q_2$ is held in the active region whereby the occurrence of switching distortion is prevented.

As the output increases, the above-described relation $V_Z = V_X$, i.e. $V_Z - V_Y = V_X - V_Y$, is changed to $V_Z - V_Y \geq V_X - V_Y$, and therefore the operating point of the PNP output transistor $Q_2$ is gradually shifted from the active region to the cut-off region. In other words, the emitter current waveforms of the output transistors $Q_1$ and $Q_2$ start falling into the cut-off regions.

This will become more apparent from the following description. If, when the output is high, the voltage developed across the resistor $R_1$ is represented by $\Delta V_1$, the voltage developed across the detection resistor $R_5$ is represented by $\Delta V_5$, the base-emitter voltages of the transistors $Q_1$, $Q_3$ and $Q_5$ are represented by $V_{BE1}$, $V_{BE3}$ and $V_{BE5}$, respectively, and the voltage across the diode $D_3$ is represented by $V_{f3}$, as indicated in FIG. 1, then normally $\Delta V_1 = \Delta V_5$ and therefore $$\Delta V_1 + V_{BE1} + V_{BE3} = V_{f3} + V_{BE5} + \Delta V_5. \quad (1)$$

However, at the time of a high output, while the collector current $i_2$ of the transistor $Q_8$ increases, the collector current $i_1$ of the transistor $Q_5$ decreases because $i = i_1 + i_2$. That is, $V_{BE5}$ is decreased by $\Delta V_{BE5}$. Therefore, the equation (1) is changed as follows:

$$\Delta V_1 + V_{BE1} + V_{BE3} \geq V_{f3} + V_{BE5} + \Delta V_5 - \Delta V_{BE5}. \quad (2)$$

The occurrence of this phenomenon can be prevented by causing idle currents to flow in the output transistors $Q_1$ and $Q_2$ to some extent. However, this technique is not entirely suitable because the thermal loss of the circuit is thereby increased.

SUMMARY OF THE INVENTION

In order to overcome this drawback, in accordance with the invention, voltage variation components at power supplying terminals adapted to supply current to the output transistors are applied to a variable bias generating circuit so as to complement the shortage of bias at the time of high power output.

More specifically, the invention provides a push-pull amplifier circuit including at least one pair of output transistors operatively coupled for performing a push-pull operation, a variable bias generating circuit for controlling the bias voltages applied to the bases of the output transistors according to currents in the output transistors to cause the output transistors to operate in active regions, and a circuit for applying voltage variation components at supply terminals through which currents are applied to the output transistors to the variable bias generating circuit to compensate for shortages in bias of the amplifier circuit at times of high power output. The output transistors are supplied current from a first power source while the variable bias generating circuit and circuit for applying voltage variation components to the variable bias generating circuit are supplied current from a second power source which should be isolated electrically from the first power source so that the variations in the output voltage of the first power source are not reflected in the voltage or currents supplied to the variable bias generating circuit and circuit for applying voltage variation components thereto.

DESCRIPTION OF THE PREFERRED EMBODIMENTS

Figure 1:
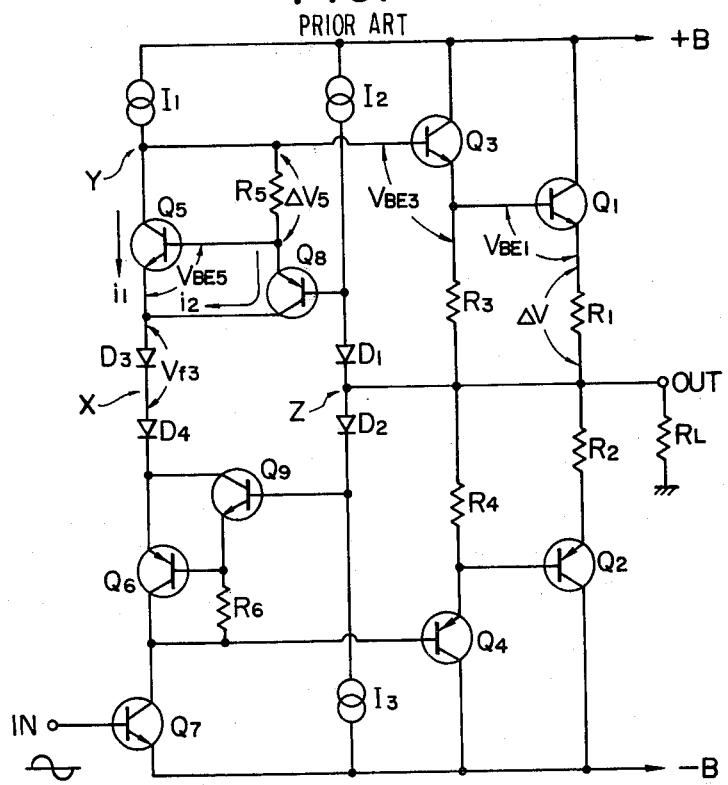
FIG. 1 is a circuit diagram showing an example of a prior push-pull amplifier circuit including a variable bias circuit.
Figure 2:
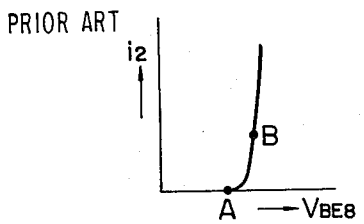
FIG. 2 is a graphical representation indicating an operating characteristic curve of a transistor employed in the amplifier circuit in FIG. 1.
Figure 3:
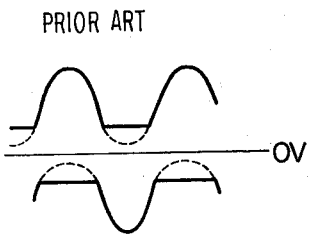
FIG. 3 is also a graphical representation indicating the emitter current waveform of an output transistor in FIG. 1.
Figure 4:
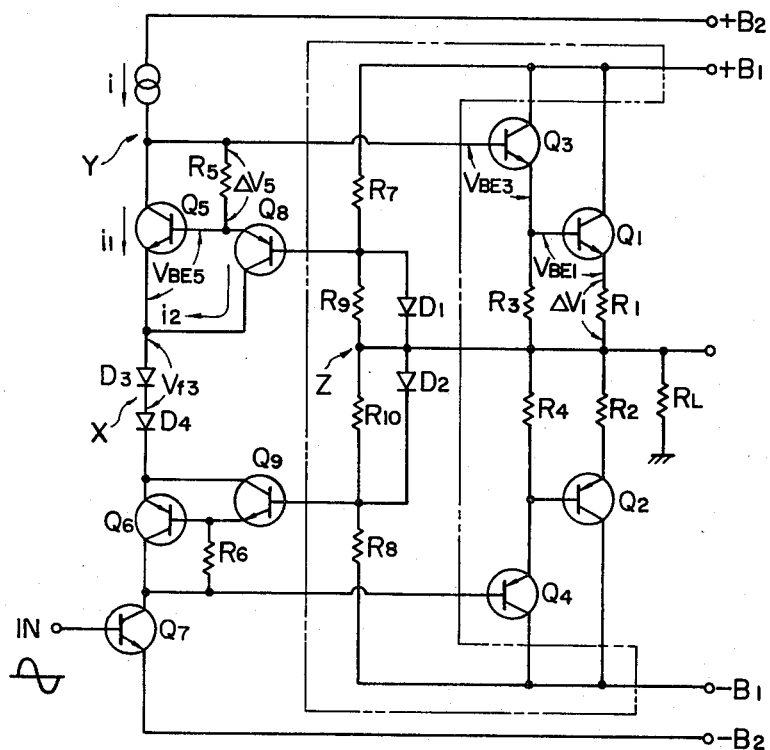
FIG. 4 is a circuit diagram of a preferred embodiment of a push-pull amplifier circuit according to the invention.

A preferred embodiment of a push-pull amplifier circuit according to the invention will be described with reference to FIG. 4 in which those components which have been described with reference to FIG. 1 are designated by the same reference characters. That is, only the additional components, which are surrounded by a chain line in FIG. 4, will be described.

First terminals of resistors $R_7$ and $R_8$ are connected to supply terminals $+B_1$ and $-B_1$ through which are supplied currents to the output transistors $Q_1$ and $Q_2$ and the second terminals of the resistors $R_7$ and $R_8$ are connected to the bases of the transistors $Q_8$ and $Q_9$, respectively. Resistors $R_9$ and $R_{10}$ are connected in parallel with the diodes $D_1$ and $D_2$, respectively. The resistors $R_7$ through $R_{10}$ form a bias compensating circuit which functions at times of high power output.

Figure 5:
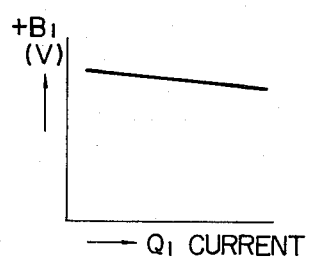
FIG. 5 is a graphical representation indicating a voltage variation characteristic curve at a supply terminal in the push-pull amplifier circuit in FIG. 4.

The output voltages at the supply terminals $+B_1$ and $-B_1$ vary with the currents supplied to the output transistors due, for instance, to non-zero resistances of power supply transformer windings (not shown). A typical variation is shown in FIG. 5. The voltage variation components are applied through the resistors $R_7$ and $R_8$ to the bases of the transistors $Q_8$ and $Q_9$, respectively. Accordingly, at times of high power output, the base potentials of the transistors $Q_8$ and $Q_9$ are reduced due to the bias applied through the resistors $R_7$ and $R_8$, respectively. That is, at the times of high power output, $\Delta V_5$ is so controlled as to satisfy $\Delta V_1 < \Delta V_5 + \Delta V_5'$ so that the decrement in the base-emitter voltage $V_{BE5}$ is compensated for.

Figure 6:
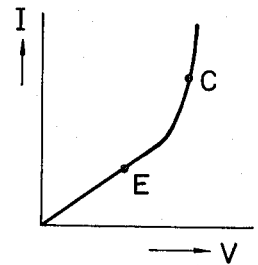
FIG. 6 is also a graphical representation indicating the operating characteristic curve of a diode in FIG. 4.

As the resistors $R_9$ and $R_{10}$ are connected to the diodes $D_1$ and $D_2$, respectively, rises of the currents in the diodes are compensated for as shown in FIG. 6. More specifically, normally the operating point of the diode $D_1$ is at a position C in FIG. 6; however, at times of high power output, the operating point is shifted to a position E so that the collector current $i_2$ of the transistor $Q_8$ is increased.

In the circuit thus constructed, at times of high power output, the above-described equation (2) is maintained as follows:

$$\Delta V_1 + V_{BE1} + V_{BE3} = V_{\beta} + V_{BE5} + \Delta V_5 - \Delta V_{BE5} + \Delta V_5. \quad (3)$$

That is, $V_Z = V_X$ is maintained at all times and the PNP and the NPN output transistors are continuously maintained in the active state.

As is apparent from the above description, in the push-pull amplifier circuit according to the invention, no switching distortion is caused over a wide output range of from small to large output. Nevertheless, the push-pull amplifier circuit of the invention has a considerably small thermal loss and is stable.

What is claimed is:

1. A push-pull amplifier circuit comprising: at least one pair of output transistors operatively coupled for performing a push-pull operation, said output transistors receiving operating current from first power supply means via supply terminals thereof; variable bias generating circuit means for controlling bias voltages applied to the bases of said output transistors according to currents in said output transistors to cause said output transistors to operate in active regions, said variable bias generating circuit means receiving operating current from second power supply means electrically isolated from said first power supply means; and circuit means for sensing voltage variations at said supply terminals and for applying voltage variation components corresponding to the sensed voltage variations to said variable bias generating circuit means to cause said variable bias generating circuit means to control said bias voltages applied to said bases of said output transistors in such a manner as to compensate for shortages in bias of said amplifier circuit at times of high power output.

2. The push-pull amplifier circuit of claim 1 wherein said circuit means for applying voltage variation components comprises first through fourth resistors coupled in series between said supply terminals through which currents are applied to said at least one pair of output transistors with a junction point between said second and third resistors being coupled to an output terminal of said amplifier circuit and a first diode coupled in parallel with said second resistor and a second diode coupled in parallel with said third resistor.

3. The push-pull amplifier circuit of claim 1 or 2 wherein said at least one pair of output transistors are coupled to be supplied current from a first power source and said variable bias generating circuit means and said circuit means for applying voltage variation components are coupled to be supplied current from a second power source isolated from said first power source.

4. A push-pull amplifier circuit comprising a first NPN transistor having a collector coupled to a positive terminal of a first power source and an emitter coupled through a first resistor to an output terminal; a second PNP transistor having a collector coupled to a negative terminal of said first power source and an emitter coupled to said output terminal through a second resistor; a third NPN transistor having a collector coupled to said positive terminal of said first power source and an emitter coupled to a base of said first NPN transistor and to said output terminal through a third resistor; a fourth PNP transistor having a collector coupled to said negative terminal of said power source and an emitter coupled to a base of said third PNP transistor and to said output terminal through a fourth resistor; a first constant current source having one terminal coupled to a positive terminal of a second power source and a second terminal coupled to a base of said third NPN transistor; a fifth NPN transistor having a collector coupled to said second terminal of said constant current source; third and fourth diodes coupled in series with one another with an anode of said third diode being coupled to an emitter of said fifth transistor and a cathode of said third diode being coupled to an anode of said fourth diode; a sixth PNP transistor having an emitter coupled to a cathode of said fourth diode; a seventh NPN transistor having a collector coupled to a collector of said sixth transistor and an emitter coupled to a negative terminal of said second power source, an input signal being coupled to a base of said seventh transistor; an eighth PNP transistor having an emitter coupled to a base of said fifth NPN transistor and a collector coupled to said emitter of said fifth NPN transistor; a fifth resistor having a first terminal coupled to said base of said fifth NPN transistor and a second terminal coupled to said second terminal of said constant current source; a ninth NPN transistor having a collector coupled to said emitter of said sixth PNP transistor and an emitter coupled to said base of said sixth PNP transistor; a sixth resistor having a first terminal coupled to said base of said sixth PNP transistor and a second terminal coupled to said emitter of said seventh NPN transistor and to a base of said fourth PNP transistor; a seventh resistor having a first terminal coupled to said positive terminal of said first power source and a second terminal coupled to a base of said eighth transistor; an eighth resistor having a first terminal coupled to said negative terminal of said first power source and a second terminal coupled to a base of said ninth NPN transistor; a ninth resistor having a first terminal coupled to said second terminal of said seventh resistor and a second coupled to said output terminal; a tenth resistor having a first terminal coupled to said second terminal of said eighth resistor and a second terminal coupled to said output terminal; a first diode having an anode coupled to said first terminal of said ninth resistor and a cathode coupled to said output terminal; and a second diode having an anode coupled to said output terminal and a cathode coupled to said first terminal of said tenth resistor.

* * * * *